(12) United States Patent
Cheng

(10) Patent No.: US 12,495,642 B2
(45) Date of Patent: Dec. 9, 2025

(54) PATTERNED SUBSTRATE, SEMICONDUCTOR DEVICE AND NANOTUBE STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 451 days.

(21) Appl. No.: 17/676,382

(22) Filed: Feb. 21, 2022

(65) Prior Publication Data

US 2022/0271195 A1 Aug. 25, 2022

(30) Foreign Application Priority Data

Feb. 19, 2021 (CN) .......................... 202120386587.X

(51) Int. Cl.
*H10H 20/815* (2025.01)
*H03H 9/02* (2006.01)
(Continued)

(52) U.S. Cl.
CPC ...... *H10H 20/815* (2025.01); *H03H 9/02031* (2013.01); *H03H 9/02102* (2013.01);
(Continued)

(58) Field of Classification Search
CPC ......... H01L 33/08; H01L 33/24; H01L 33/32; H01L 33/12; H01L 33/20; H01L 27/15;
(Continued)

(56) References Cited

U.S. PATENT DOCUMENTS

2012/0258286 A1* 10/2012 Amano ................. C30B 29/403
117/97
2013/0320353 A1* 12/2013 Kryiouk ............ H01L 21/02488
257/76
(Continued)

FOREIGN PATENT DOCUMENTS

KR 20150057051 A * 5/2015

OTHER PUBLICATIONS

For Translation of KR-20150057051-A: "Semiconductor Light Emitting Diode and Method of Fabricating the Same" by Suh Duk Il et al. (Year: 2015).*

*Primary Examiner* — Jacob Y Choi
*Assistant Examiner* — Ashley Nicole Blackwell
(74) *Attorney, Agent, or Firm* — Westbridge IP LLC

(57) ABSTRACT

Disclosed are a patterned substrate, a semiconductor device and a nanotube structure. The patterned substrate includes, in a vertical direction, a base plate and an AlN layer that are sequentially stacked. The patterned substrate includes, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, and at least part of the base plate is left below each of the plurality of grooves. According to the patterned substrate in the present application, a structure of the AlN layer is changed, so that an epitaxial structure grown subsequently is prevented from warping.

18 Claims, 9 Drawing Sheets

(51) Int. Cl.
*H03H 9/56* (2006.01)
*H10H 20/813* (2025.01)
*H10H 20/821* (2025.01)
*H10H 20/825* (2025.01)

(52) U.S. Cl.
CPC ........ *H03H 9/02133* (2013.01); *H03H 9/562* (2013.01); *H10H 20/813* (2025.01); *H10H 20/821* (2025.01); *H10H 20/825* (2025.01)

(58) Field of Classification Search
CPC ........... H03H 9/02102; H03H 9/02133; H03H 9/02031; H03H 9/562; H10H 20/815; H10H 20/813; H10H 20/821; H10H 20/825; H10H 20/819; H10H 29/10
USPC ....................................................... 257/103
See application file for complete search history.

(56) References Cited

U.S. PATENT DOCUMENTS

| | | | |
|---|---|---|---|
| 2015/0118777 A1* | 4/2015 | Seo .................. | H01L 33/32 |
| | | | 438/34 |
| 2015/0287884 A1* | 10/2015 | Higashihara ......... | H10H 20/819 |
| | | | 257/76 |
| 2021/0193869 A1* | 6/2021 | Wildeson ............ | H01L 21/0254 |

\* cited by examiner

PATTERNED SUBSTRATE, SEMICONDUCTOR DEVICE AND NANOTUBE STRUCTURE

CROSS-REFERENCE TO RELATED APPLICATIONS

This application claims priority to Chinese Patent Application No. 202120386587.X, field on Feb. 19, 2021, which is hereby incorporated by reference in its entirety.

TECHNICAL FIELD

The present application relates to the field of semiconductors, in particular to a patterned substrate, a semiconductor device and a nanotube structure.

BACKGROUND

Light Emitting Diodes (LEDs) have been widely applied to the prior art. In the prior art, as the LEDs have been widely used, a deep ultraviolet LED technology becomes a more advanced technology among all LED technologies.

In the prior art, a deep ultraviolet LED chip is usually produced by growing an Aluminum Nitride (AlN) single crystal on a sapphire substrate, and then growing an epitaxial structure on the AlN single crystal. However, an epitaxial wafer warps easily if the epitaxial structure is directly grown on the AlN single crystal, and it is difficult to guarantee efficiency and yield of mass production.

SUMMARY

The present application provides a patterned substrate, a semiconductor device and a nanotube structure. A structure of an AlN layer is changed, so that an epitaxial structure grown subsequently is prevented from warping, and stress in a thinning process of the substrate is reduced, thereby avoiding a fracture of the substrate.

In order to achieve the above purposes, an embodiment of the present application provides a patterned substrate. The patterned substrate includes, in a vertical direction, a base plate and an AlN layer that are sequentially stacked. The patterned substrate includes, in the vertical direction, a first surface and a second surface that are oppositely arranged, and a bottom surface of the base plate is the first surface of the patterned substrate. The second surface of the patterned substrate is a patterned surface, and the second surface is provided with a plurality of grooves that are independent of each other in a horizontal direction and are arranged in an array. At least part of the base plate is left below each of the plurality of grooves.

Optionally, the patterned substrate is annealed.

Optionally, an upper surface of the AlN layer is the second surface of the patterned substrate, and the plurality of grooves are formed in the AlN layer.

Optionally, the patterned substrate further includes a dielectric layer; the dielectric layer covers, in the vertical direction, one side, far away from the base plate, of the AlN layer, and an upper surface of the dielectric layer is the second surface of the patterned substrate. The plurality of grooves are formed in the dielectric layer, and a depth of the groove is greater than a thickness of the dielectric layer.

Optionally, the dielectric layer is made of one of SiN, $SiO_2$ and $Al_2O_3$.

Optionally, the thickness of the dielectric layer ranges from 1 μm to 3 μm.

Optionally, a thickness of the AlN layer ranges from 1 μm to 2 μm.

Optionally, the groove is in a shape of a circle or a polygon.

Optionally, a width of the groove ranges from 20 μm to 150 μm.

Optionally, and/or a distance between outer edges, on the second surface, of two adjacent grooves is less than or equal to 10 μm.

Optionally, a width of the groove gradually increases from bottom to top in the vertical direction, and a side wall of the groove is an inclined plane.

Optionally, a width of the groove gradually increases from bottom to top in the vertical direction, and a side wall of the groove is a concave surface.

Optionally, a width of the groove gradually increases from bottom to top in the vertical direction, and a side wall of the groove is a convex surface.

Optionally, the groove includes, from bottom to top in the vertical direction, a first part and a second part that are connected with each other, and a width of the second part is greater than a width of the first part.

The width of the first part remains unchanged from bottom to top in the vertical direction, and the width of the second part gradually increases from bottom to top in the vertical direction.

Optionally, the plurality of grooves are sequentially arranged, in a column direction, into a plurality of rows; and two adjacent rows of the plurality of grooves are arranged in an aligned manner or a staggered manner.

Optionally, the plurality of grooves are sequentially arranged, in a row direction, into a plurality of columns; and two adjacent columns of the plurality of grooves are arranged in an aligned manner or a staggered manner.

An embodiment of the present application further provides a semiconductor device, including: a patterned substrate, wherein the patterned substrate includes, in a vertical direction, a base plate and an AlN layer that are sequentially stacked, the patterned substrate includes, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, and at least part of the base plate is left below each of the plurality of grooves; and an epitaxial structure, disposed on a side of the patterned substrate.

Optionally, the epitaxial structure includes: an n-type semiconductor layer, a p-type semiconductor layer, and an active layer disposed between the n-type semiconductor layer and the p-type semiconductor layer.

Optionally, the epitaxial structure includes an AlN structure or an AlScN structure.

An embodiment of the present application further provides a nanotube structure, including: a patterned substrate, wherein the patterned substrate includes, in a vertical direction, a base plate and an AlN layer that are sequentially stacked, the patterned substrate includes, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, and at least part of the base plate is left below each of the plurality of grooves; and a connection layer, disposed on a side of the patterned substrate.

According to the patterned substrate in the foregoing embodiments, a structure of an AlN layer is changed, so that an epitaxial structure grown subsequently is prevented from warping, and stress in a thinning process of the substrate is reduced, thereby avoiding a fracture of the substrate.

DETAILED DESCRIPTION

Figure 1:
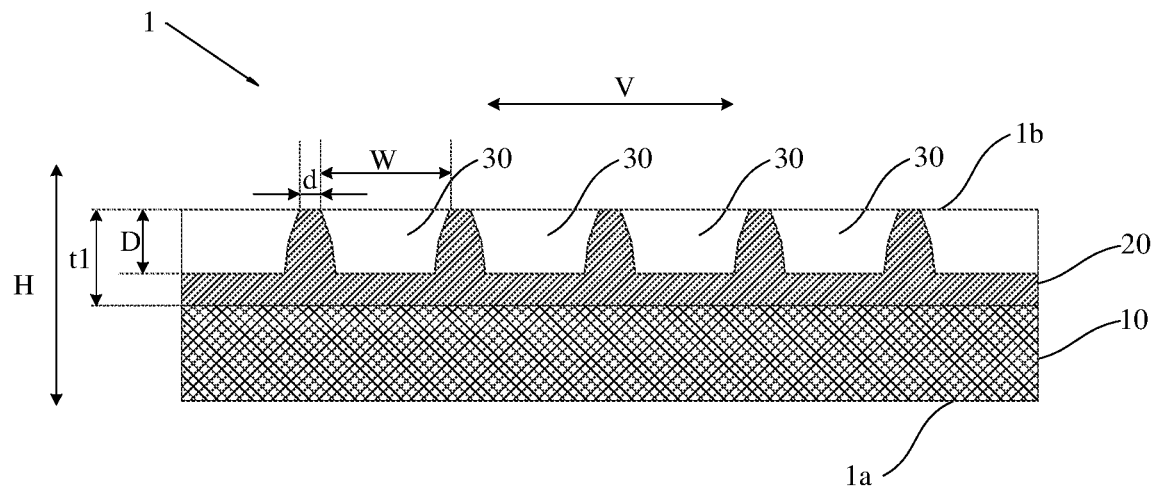
FIG. 1 is a partial cross-sectional schematic structural diagram of a patterned substrate according to an embodiment of the present application.

Exemplary embodiments are described in detail herein, and examples of the exemplary embodiments are presented in the accompanying drawings. When the following description relates to the accompanying drawings, unless otherwise specified, same numbers in different accompanying drawings represent a same element or similar elements. Implementations described in the following exemplary embodiments do not represent all implementations consistent with the present application. Instead, they are merely examples of apparatuses and methods consistent with some aspects related to the present application as recited in the appended claims.

Terms used in the present application are merely intended to describe particular embodiments but are not intended to limit the present application. Unless otherwise defined, technical and scientific terms used in the present application should have the ordinary meanings as commonly understood by those of ordinary skill in the art of the present application. Words "One", "a", and the like used in this specification of the present application and the claims do not represent quantity limitation, but indicate that there is at least one. Words "include", "comprise", or the like indicate that an element or article before the word covers elements, articles, or equivalents listed after the word, without precluding the possibility of covering other elements or articles. Words "connection", "connect", and the like are not limited to physical or mechanical connection and may include electrical connection, and the connection may be direct or indirect. The term "a plurality of" means including two, and is equivalent to at least two. The singular forms "a", "the", and "this" used in this specification of the present application and the appended claims may also encompass plural forms, unless the context clearly indicates otherwise. It should also be understood that the term "and/or" used in this specification includes any or all possible combinations of one or more associated listed items.

Embodiment 1

Referring to FIG. 1 to FIG. 10, this embodiment provides a patterned substrate 1. The patterned substrate 1 includes, in a vertical direction H, a base plate 10 and an AlN layer 20 that are sequentially stacked. The patterned substrate 1 includes, in the vertical direction H, a first surface 1a and a second surface 1b that are oppositely arranged, a bottom surface of the base plate 10 is the first surface 1a of the patterned substrate 1, an upper surface of the AlN layer 20 is the second surface 1b of the patterned substrate 1, and the second surface 1b of the patterned substrate 1 is a patterned surface. The second surface 1b of the patterned substrate 1 is provided with a plurality of grooves 30 that are independent of each other in a horizontal direction V, to form the patterned surface, that is, the grooves 30 are formed in the AlN layer 20. The plurality of grooves 30 are arranged in an array, and at least part of the base plate 10 is left below each of the grooves 30. The vertical direction may be a direction perpendicular to the second surface, and the horizontal direction may be a direction parallel to the second surface.

In an embodiment, the patterned substrate 1 is annealed, so that surface defects of the AlN layer may be reduced, thereby improving the crystal quality.

In this way, a structure of the AlN layer is changed by forming the grooves 30 that are independent of each other in the horizontal direction on the second surface 1b of the patterned substrate 1, so that an epitaxial structure grown subsequently is prevented from warping, and stress in a thinning process of the substrate is reduced, thereby avoiding a fracture of the substrate. In addition, annealing treatment is performed on the patterned substrate 1, so that the crystal quality of AlN can be further improved, thereby further improving the overall quality of a device.

It should be noted that, when annealing treatment is performed on the patterned substrate 1, because the patterned surface of the patterned substrate 1 has a larger surface area, an effective annealing temperature can be lowered, thereby effectively improving the crystal quality of AlN without damaging a surface of the AlN layer 20.

The patterned surface is formed by forming, in the second surface 1b of the patterned substrate 1, the plurality of grooves 30 that are independent of each other in the horizontal direction, that is, areas, different from the grooves 30, on the second surface 1b of the patterned substrate 1 are connected to each other, thereby constituting an integral structure. There are three cases for a depth of the groove 30.

Case 1: as shown in FIG. 1, the depth D of the groove 30 is less than a thickness t1 of the AlN layer 20, that is, the base plate 10 and a part of the AlN layer 20 are left below the groove 30.

Figure 2:
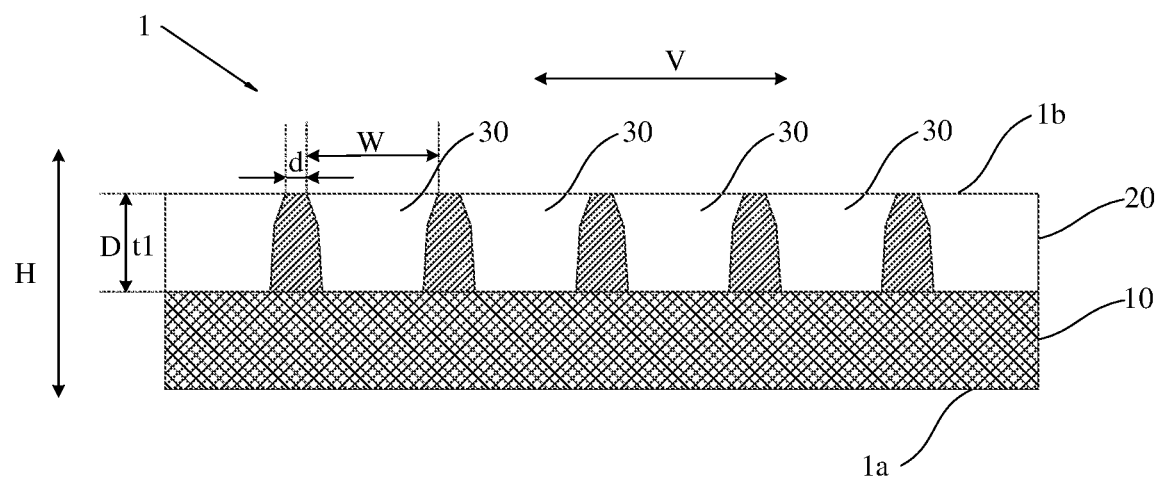
FIG. 2 is a partial cross-sectional schematic structural diagram of a patterned substrate according to another embodiment of the present application.

Case 2: as shown in FIG. 2, the depth D of the groove 30 is equal to a thickness t1 of the AlN layer 20, that is, the base plate 10 is left below the groove 30.

Figure 3:
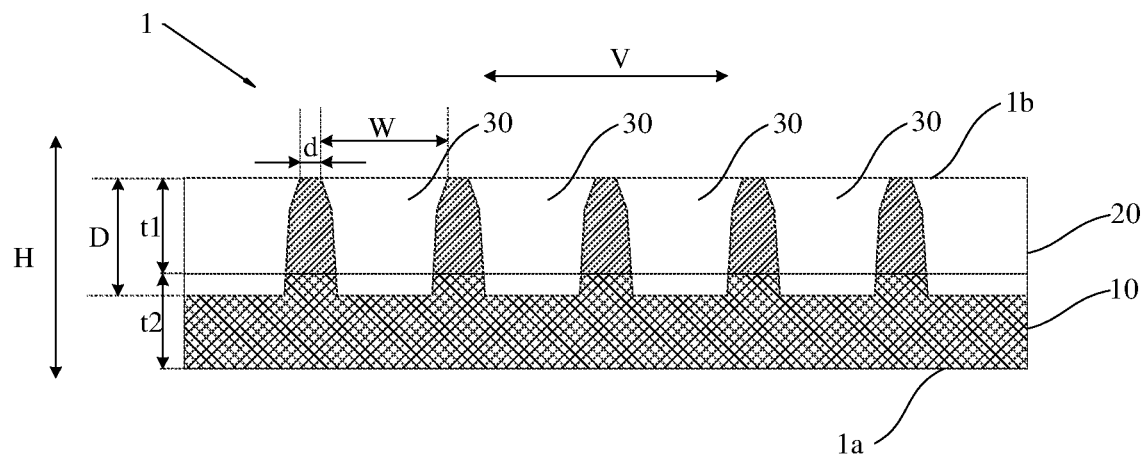
FIG. 3 is a partial cross-sectional schematic structural diagram of a patterned substrate according to another embodiment of the present application.

Case 3: as shown in FIG. 3, the depth D of the groove 30 is greater than a thickness t1 of the AlN layer 20, and is less than a thickness of the patterned substrate 1 (namely, a sum of the thickness t1 of the AlN layer 20 and a thickness t2 of the base plate 10), that is, a part of the base plate 10 is left below the groove 30.

Optionally, the thickness t1 of the AlN layer 20 ranges from 1 μm to 2 μm. The base plate 10 is made of one of Si, sapphire, and SiC.

Figure 4:
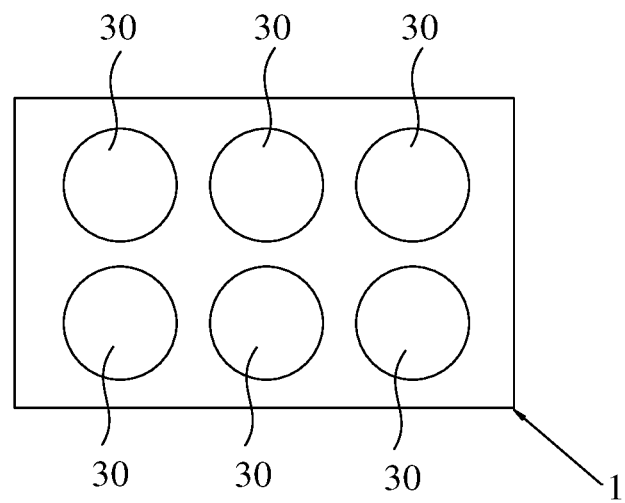
FIG. 4 is a top-view schematic structural diagram of a patterned substrate according to an embodiment of the present application.
Figure 5:
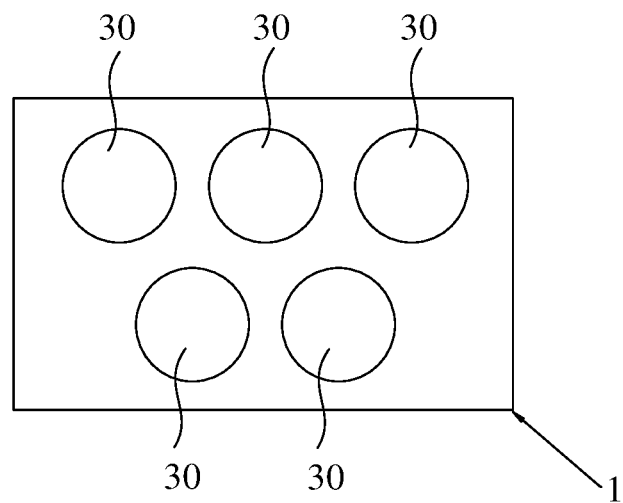
FIG. 5 is a top-view schematic structural diagram of a patterned substrate according to another embodiment of the present application.
Figure 6:
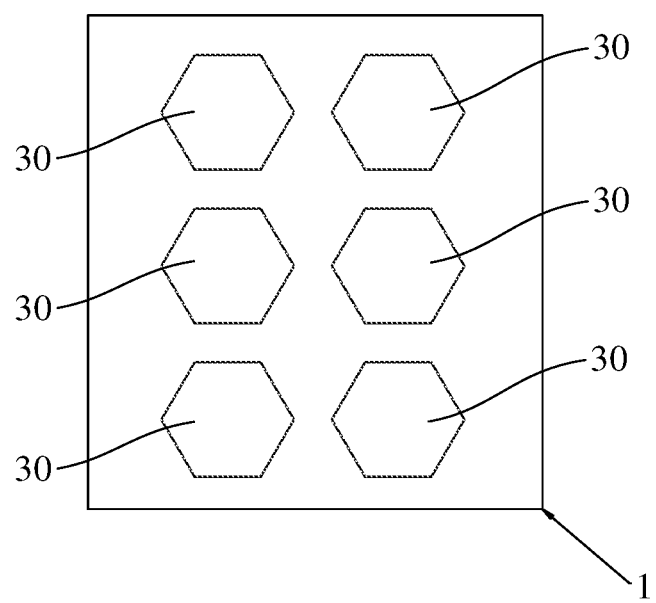
FIG. 6 is a top-view schematic structural diagram of a patterned substrate according to another embodiment of the present application.
Figure 7:
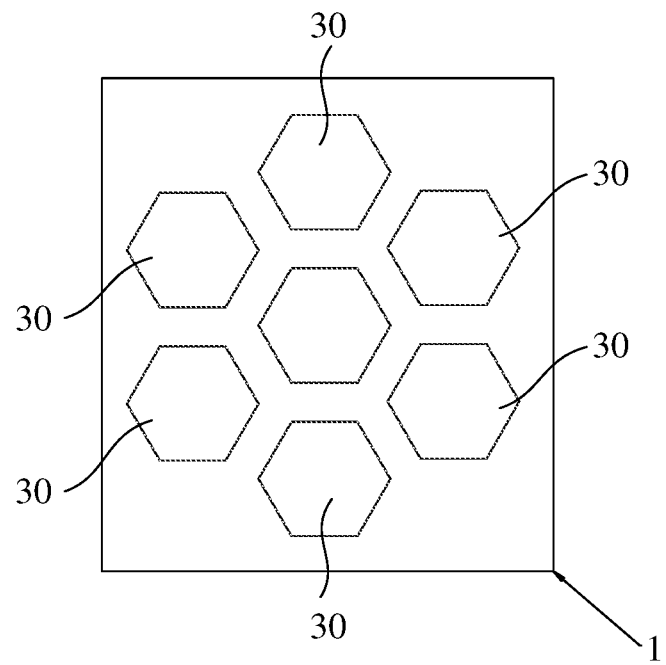
FIG. 7 is a top-view schematic structural diagram of a patterned substrate according to another embodiment of the present application.

Optionally, the groove 30 is in a shape of a circle or polygon. The polygon may be a triangle, diamond, rectangle, square, or the like. Top views of the grooves 30 on the second surface 1b of the patterned substrate 1 are shown in FIG. 4 to FIG. 7. The grooves 30 in FIG. 4 and FIG. 5 are circles; and the grooves 30 in FIG. 6 and FIG. 7 are hexagons.

There are a plurality of manners of arranging the plurality of grooves 30 in an array. As shown in FIG. 4, the plurality of grooves 30 may be sequentially arranged, in a column direction, into a plurality of rows. Adjacent two rows of grooves 30 are arranged in an aligned manner; or in another implementation, as shown in FIG. 5, adjacent two rows of grooves 30 are arranged in a staggered manner. Alternatively, in still another implementation, as shown in FIG. 6, the plurality of grooves 30 may be sequentially arranged, in a row direction, into a plurality of columns. Adjacent two columns of grooves 30 are arranged in an aligned manner; or in yet another implementation, as shown in FIG. 7, adjacent two columns of grooves 30 are arranged in a staggered manner.

Referring to FIG. 1 to FIG. 3 again, a width W of the groove 30 ranges from 20 μm to 150 μm; and a distance d between outer edges, on the second surface 1b, of two adjacent grooves 30 is less than or equal to 10 μm. In this way, a requirement of an annealing temperature required for high-temperature annealing treatment can be lowered by limiting the distance between the outer edges, on the second surface 1b, of two adjacent grooves 30, that is, the annealing temperature required for high-temperature annealing treatment is relatively low. It should be noted that, a shorter distance between the outer edges, on the second surface 1b, of two adjacent grooves 30 leads to a lower annealing temperature required for high-temperature annealing treatment, so that damage to a surface can be better avoided.

More preferably, a distance d between the outer edges, on the second surface 1b, of two adjacent grooves 30 is less than or equal to 2 μm. Most preferably, the distance d between the outer edges, on the second surface 1b, of two adjacent grooves 30 is less than or equal to 0.5 μm. As described above, a shorter distance between the outer edges, on the second surface 1b, of two adjacent grooves 30 leads to a lower annealing temperature required for high-temperature annealing treatment, so that damage to a surface can be further avoided.

In some embodiments, the width W of the groove 30 may remain unchanged from bottom to top in the vertical direction.

In other embodiments, the width W of the groove 30 gradually increases from bottom to top in the vertical direction.

Figure 8:
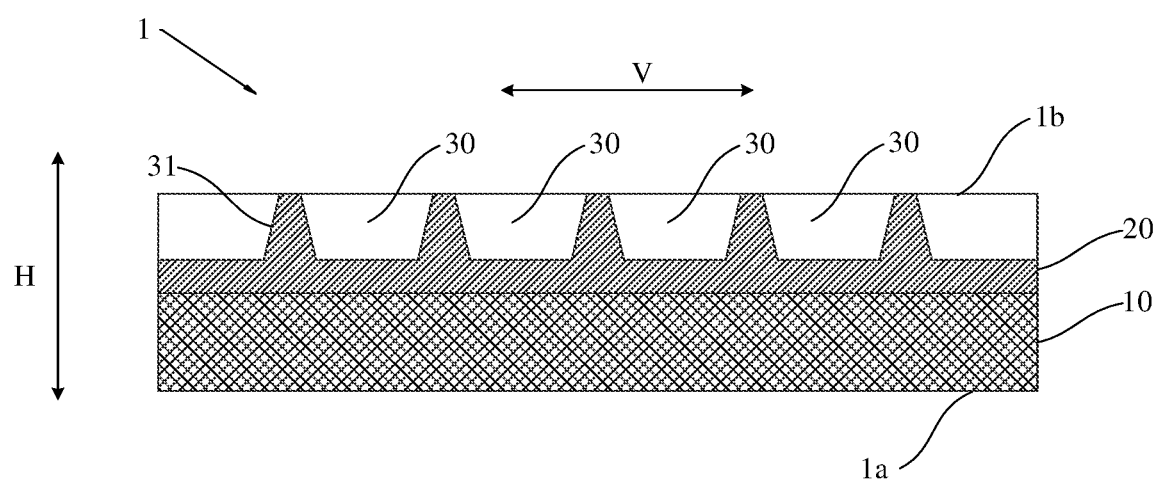
FIG. 8 is a partial cross-sectional schematic structural diagram of a patterned substrate in which a side wall of a groove is an inclined plane according to an embodiment of the present application.
Figure 9:
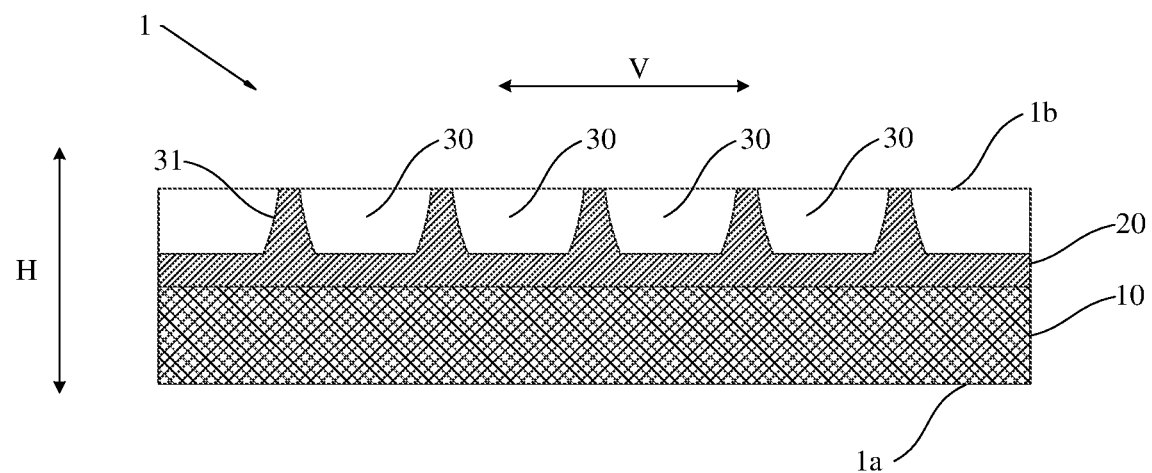
FIG. 9 is a partial cross-sectional schematic structural diagram of a patterned substrate in which a side wall of a groove is a concave surface according to an embodiment of the present application.
Figure 10:
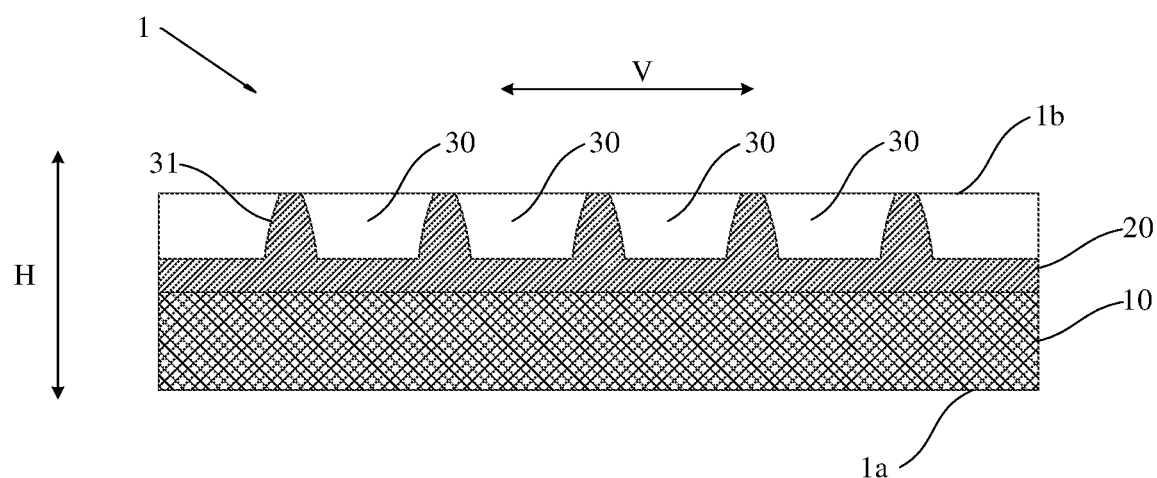
FIG. 10 is a partial cross-sectional schematic structural diagram of a patterned substrate in which a side wall of a groove is a convex surface according to an embodiment of the present application.

Further, a side wall 31 of the groove may be set to surfaces of different shapes. As shown in FIG. 8, the side wall 31 of the groove is an inclined plane; or as shown in FIG. 9, the side wall 31 of the groove is a concave surface; or as shown in FIG. 10, the side wall 31 of the groove is a convex surface. Alternatively, a side wall 31 of the groove may be composed of a plurality of planes with different inclination angles. As shown in FIG. 1 to FIG. 3, the side wall 31 of the groove is composed of two planes with different inclination angles. Alternatively, the side wall 31 of the groove may be composed of a plane and a curved surface. In this way, the patterned surface of the patterned substrate 1 is further enabled to have a larger surface area by setting a specific structure of the groove 30.

In some other embodiments, the width W of the groove 30 gradually decreases from bottom to top in the vertical direction.

Figure 11:
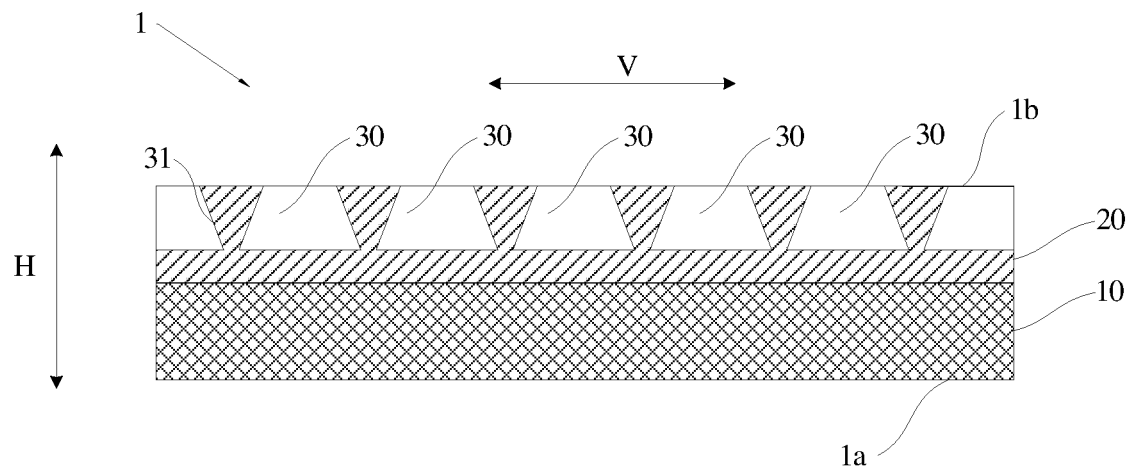
FIG. 11 is a partial cross-sectional schematic structural diagram of a patterned substrate in which a side wall of a groove is an inclined plane according to another embodiment of the present application.
Figure 12:
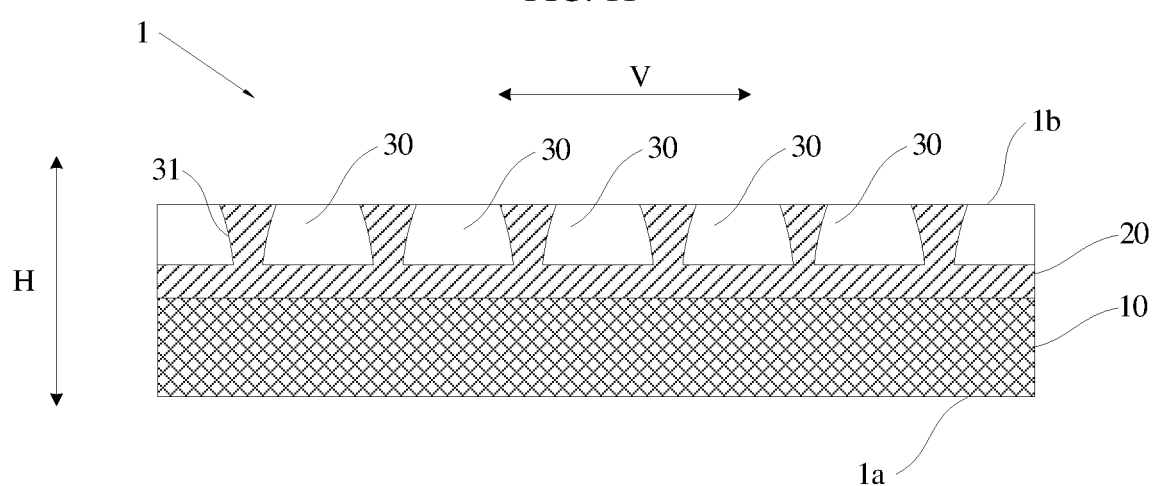
FIG. 12 is a partial cross-sectional schematic structural diagram of a patterned substrate in which a side wall of a groove is a concave surface according to another embodiment of the present application.
Figure 13:
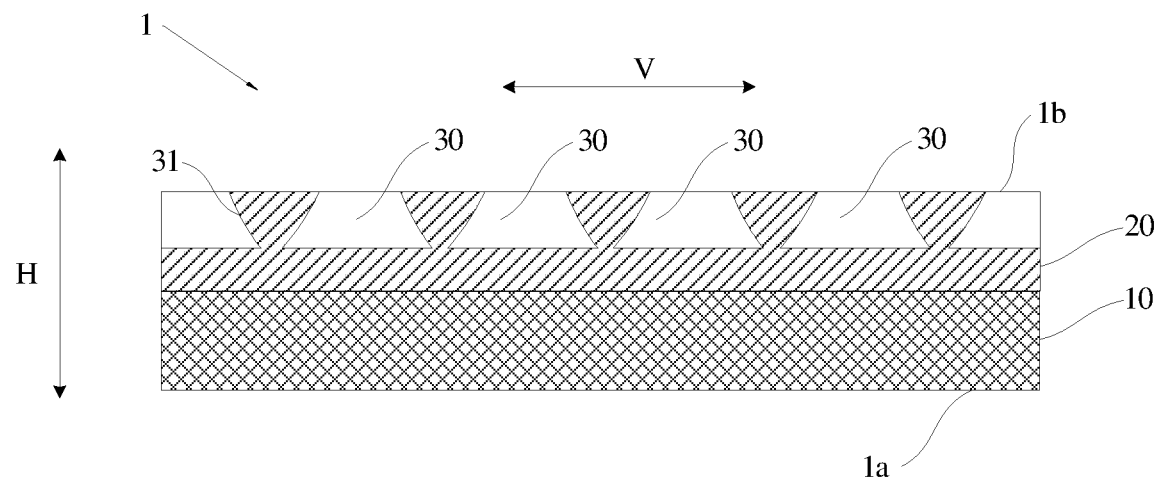
FIG. 13 is a partial cross-sectional schematic structural diagram of a patterned substrate in which a side wall of a groove is a convex surface according to another embodiment of the present application.

Further, the side wall 31 of the groove may be set to surfaces of different shapes. As shown in FIG. 11, the side wall 31 of the groove is an inclined plane; or as shown in FIG. 12, the side wall 31 of the groove is a concave surface; or as shown in FIG. 13, the side wall 31 of the groove is a convex surface. Alternatively, the side wall 31 of the groove may be composed of a plurality of planes with different inclination angles. Alternatively, the side wall 31 of the groove may be composed of a plane and a curved surface. In this way, the patterned surface of the patterned substrate 1 is further enabled, by setting a specific structure of the groove 30, to have a larger surface area.

Figure 14:
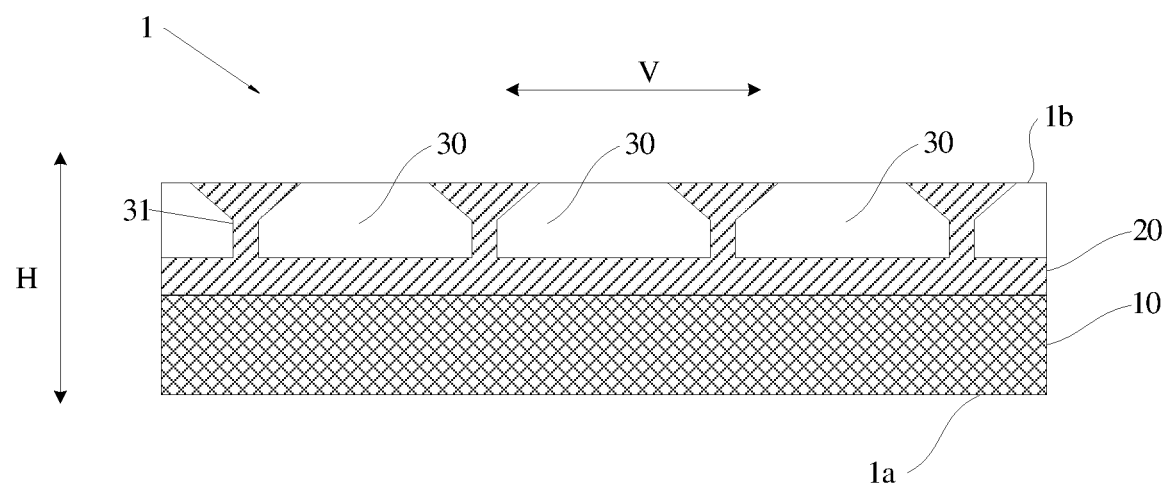
FIG. 14 is a partial cross-sectional schematic structural diagram of a patterned substrate according to another embodiment of the present application.

In some other embodiments, the width W of the groove 30 may remain unchanged first and then decrease from bottom to top in the vertical direction, as shown in FIG. 14. Alternatively, the width W of the groove 30 may first remain unchanged and then increase from bottom to top in the vertical direction, or may first increase and then remain unchanged, or may first decrease and then remain unchanged. As long as the surface area of the patterned surface can be increased, the width W of the groove 30 from bottom to top in the vertical direction may be appropriately designed as required.

Embodiment 2

Figure 15:
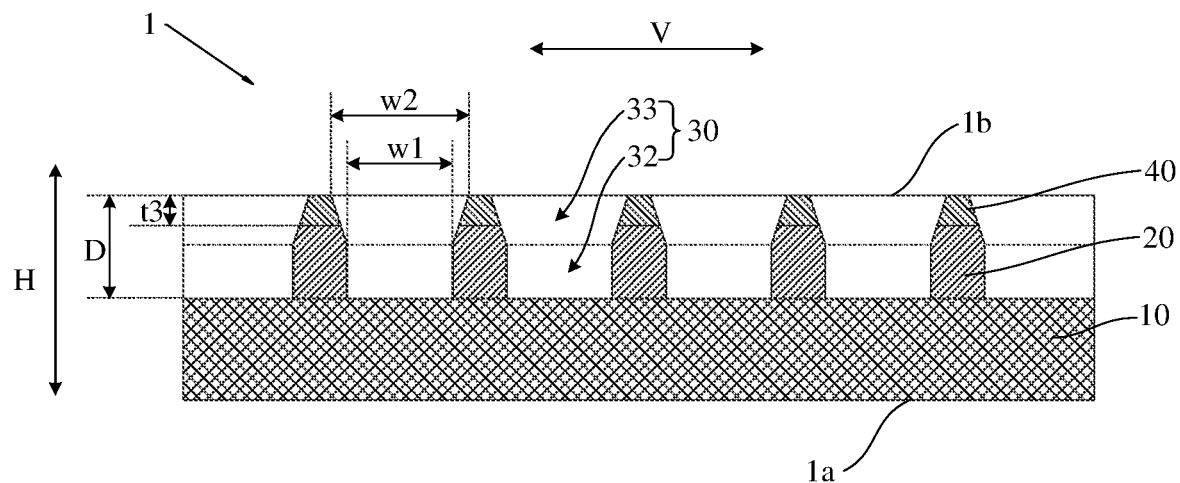
FIG. 15 is a partial cross-sectional schematic structural diagram of a patterned substrate according to another embodiment of the present application.

As shown in FIG. 15, this embodiment provides a patterned substrate. A structure of the patterned substrate is basically the same as the structure of the patterned substrate in Embodiment 1. The two structures differ as follows: the patterned substrate 1 further includes a dielectric layer 40. The dielectric layer 40 covers, in the vertical direction H, one side, far away from the base plate 10, of the AlN layer 20. An upper surface of the dielectric layer 40 is the second surface 1b of the patterned substrate 1. The grooves 30 are formed in the dielectric layer 40. The depth D of the groove 30 is greater than a thickness t3 of the dielectric layer 40.

When annealing treatment is performed on the patterned substrate 1, the AlN layer 20 below the dielectric layer 40 can be protected by disposing the dielectric layer 40.

The dielectric layer 40 is made of one of SiN, $SiO_2$ and $Al_2O_3$.

Optionally, the thickness of the dielectric layer 40 ranges from 1 μm to 3 μm.

In this embodiment, the groove 30 includes, from bottom to top in the vertical direction H, a first part 32 and a second part 33 that are connected with each other, and a width of the second part 33 is greater than a width of the first part 32.

For example, the width w1 of the first part 32 remains unchanged from bottom to top in the vertical direction H, and the width w2 of the second part 33 gradually increases from bottom to top in the vertical direction H. In other embodiments, alternatively, the width of the first part 32 gradually increases from bottom to top in the vertical direction, the width of the second part 33 gradually increases from bottom to top in the vertical direction. Further, an increasing amplitude of the width w1 of the first part 32 is less than an increasing amplitude of the width w2 of the second part 33. In this way, the patterned surface of the patterned substrate 1 is further enabled to have a larger surface area by setting a specific structure of the groove 30. In other embodiments, the width w1 of the first part 32 remains unchanged from bottom to top in the vertical direction H, the width w2 of the second part 33 remains unchanged from bottom to top in the vertical direction H, and w1 is less than w2. Alternatively, the width of the first part 32 gradually increases from bottom to top in the vertical direction, the width of the second part 33 remains unchanged from bottom to top in the vertical direction, and w1 is less than w2.

Optionally, the width of the second part 33 is equal to the width of the first part 32.

For example, the width w1 of the first part 32 remains unchanged from bottom to top in the vertical direction H, the width w2 of the second part 33 remains unchanged from bottom to top in the vertical direction H, and w1 is equal to w2.

Optionally, the width of the second part 33 is less than the width of the first part 32.

For example, the width w1 of the first part 32 remains unchanged from bottom to top in the vertical direction H, and the width w2 of the second part 33 gradually decreases from bottom to top in the vertical direction H. In other embodiments, alternatively, the width of the first part 32 gradually decreases from bottom to top in the vertical direction, and the width of the second part 33 gradually decreases from bottom to top in the vertical direction. Further, a decrease amplitude of the width w1 of the first part 32 is less than a decrease amplitude of the width w2 of the second part 33. In this way, the patterned surface of the patterned substrate 1 is further enabled, by setting a specific structure of the groove 30, to have a larger surface area. In other embodiments, the width w1 of the first part 32 remains unchanged from bottom to top in the vertical direction H, the width w2 of the second part 33 remains unchanged from bottom to top in the vertical direction H, and w1 is greater than w2. Alternatively, the width of the first part 32 gradually decreases from bottom to top in the vertical direction, the width of the second part 33 remains unchanged from bottom to top in the vertical direction, and w1 is greater than w2.

In this embodiment, a structure of the AlN layer is changed by forming the grooves 30 that are independent of each other in the horizontal direction on the second surface 1b of the patterned substrate 1, so that an epitaxial structure grown subsequently is prevented from warping, and stress in a thinning process of the substrate is reduced, thereby avoiding a fracture of the substrate. In addition, annealing treatment is performed on the patterned substrate 1, so that the crystal quality of AlN can be further improved, thereby further improving the overall quality of a device.

An embodiment of the present application further provides a semiconductor device, including the patterned substrate (excluding the dielectric layer) in the foregoing embodiments and an epitaxial structure disposed on a side of the patterned substrate.

Figure 16:
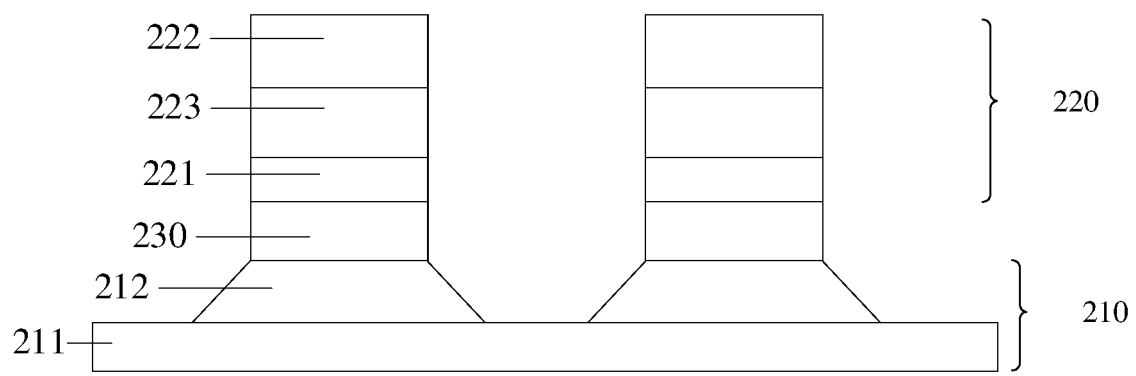
FIG. 16 is a partial cross-sectional schematic structural diagram of a semiconductor device according to an embodiment of the present application.

As shown in FIG. 16, a semiconductor device 200 includes a patterned substrate 210 and an epitaxial structure 220. For the patterned substrate 210, reference may be made to the foregoing patterned substrate 1 (excluding the dielectric layer), for example, the patterned substrate 210 may include a base plate 211 and an AlN layer 212. The epitaxial structure 220 may include an n-type semiconductor layer 221, a p-type semiconductor layer 222, and an active layer 223 disposed between the n-type semiconductor layer 221 and the p-type semiconductor layer 222. The active layer 223 may include at least one of a single quantum well structure, a multi-quantum well (MQW) structure, a quantum wire structure, and a quantum dot structure. The n-type semiconductor 221 may include at least three elements of Al, Ga, and N. The p-type semiconductor 222 may include at least three elements of Al, Ga, and N.

The semiconductor device 200 may be an ultraviolet LED, and the semiconductor device 200 may further include an N electrode and a P electrode. The N electrode may be disposed on the n-type semiconductor layer 221, and the P electrode may be disposed on the p-type semiconductor layer 222.

In the embodiment, a connection layer 230, for example, an AlN layer, may be further disposed between the patterned substrate 210 and the epitaxial structure 220. For example, the connection layer 230 may be further grown on the AlN layer of the patterned substrate 210, facilitating subsequent growth of the epitaxial structure 220 on the connection layer 230. In an embodiment, a dielectric layer may be first deposited on a surface, provided with an AlN layer, of the patterned substrate 210, and the dielectric layer may be etched, to make a surface of the AlN layer of the patterned substrate 210 exposed, so that an AlN layer continues to be deposited on the surface of the AlN layer of the patterned substrate 210, thereby forming a columnar AlN layer on the patterned substrate 210. The epitaxial structure 220 may be further grown on the columnar AlN layer. After the epitaxial structure 220 is grown, the remaining dielectric layer may be removed to obtain the semiconductor device 200.

The connection layer is equivalent to a buffer layer, which may improve the crystal quality of the subsequent epitaxial structure and reduce defects.

An embodiment of the present application further provides a semiconductor device, including the patterned substrate (excluding the dielectric layer) in the foregoing embodiments and an epitaxial structure disposed on a side of the patterned substrate.

Figure 17:
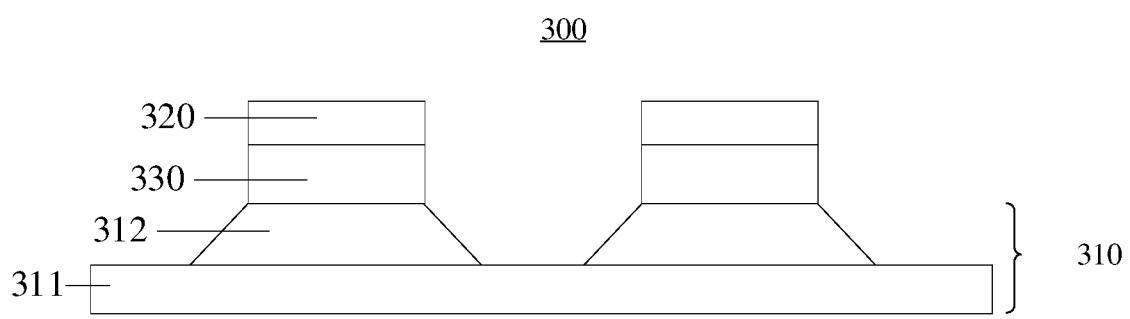
FIG. 17 is a partial cross-sectional schematic structural diagram of a semiconductor device according to another embodiment of the present application.

As shown in FIG. 17, a semiconductor device 300 includes a patterned substrate 310 and an epitaxial structure 320. For the patterned substrate 310, reference may be made to the foregoing patterned substrate 1 (excluding the dielectric layer), for example, the patterned substrate 310 may include a base plate 311 and an AlN layer 312. The epitaxial structure 320 may include an AlN structure or an AlScN structure. The semiconductor device 300 may be a filter.

In the embodiment, a connection layer 330, for example, an AlN layer, may be further disposed between the patterned substrate 310 and the epitaxial structure 320. For example, the connection layer 330 may be further grown on the AlN layer of the patterned substrate 310, facilitating subsequent growth of the epitaxial structure 320 on the connection layer 330. For a formation process of the connection layer 330, reference may be made to the formation process of the connection layer 230 described above. Details are not repeated herein. The epitaxial structure 320 may be further grown on the connection layer 330. After the epitaxial structure 320 is grown, the remaining dielectric layer may be removed to obtain the semiconductor device 300.

An embodiment of the present application further provides a semiconductor device, including the patterned substrate (excluding the dielectric layer) in the foregoing embodiments and a connection layer disposed on a side of the patterned substrate.

Figure 18:
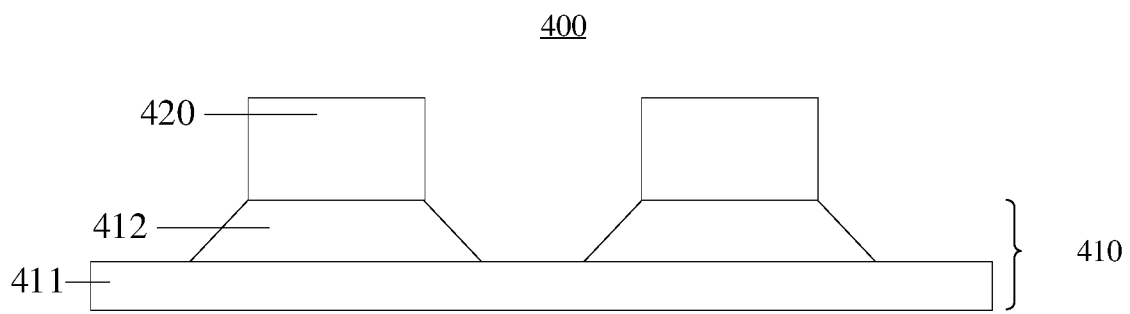
FIG. 18 is a partial cross-sectional schematic structural diagram of a nanotube structure according to an embodiment of the present application.

As shown in FIG. 18, a semiconductor device 400 includes a patterned substrate 410 and a connection structure 420. For the patterned substrate 410, reference may be made to the foregoing patterned substrate 1 (excluding the dielectric layer), for example, the patterned substrate 410 may include a base plate 411 and an AlN layer 412. The connection layer 420 may be an AlN layer or an AlScN layer. The semiconductor device 400 may be a nanotube structure.

For example, the connection layer 420 may be further grown on the AlN layer of the patterned substrate 410, to obtain a nanotube structure. For a formation process of the connection layer 420, reference may be made to the formation process of the connection layer 230 described above. Details are not repeated herein. After the columnar connection layer 420 is formed, the remaining dielectric layer can be removed to obtain a nanotube structure. Eventually, a one-dimensional nanotube structure is formed.

Described above are merely preferred embodiments of the present application, but are not intended to limit the present application. Any modifications, equivalent replacements, improvements and the like made within the spirit and principles of the present application should be included within the protection scope of the present application.

What is claimed is:

1. A patterned substrate, wherein the patterned substrate comprises, in a vertical direction, a base plate and an AlN layer that are sequentially stacked, the patterned substrate comprises, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, at least a part of the base plate is left below each of the plurality of grooves, the vertical direction is a direction perpendicular to the second surface, and the horizontal direction is a direction parallel to the second surface, and an interface between the base plate and the AlN layer is parallel to the horizontal direction; the patterned surface is an annealed surface; each of the plurality of grooves comprises, from bottom to top in the vertical direction, a first part and a second part that are connected with each other, a width of the second part is greater than a width of the first part; the width of the first part gradually increases from bottom to top in the vertical direction, the width of the second part gradually increases from bottom to top in the vertical direction, and an increasing amplitude of the width of the first part is less than an increasing amplitude of the width of the second part, wherein a thickness of a portion of the AlN layer below each of the plurality of grooves is less than a thickness of a portion of the AlN layer outside the plurality of grooves.

2. The patterned substrate according to claim 1, wherein an upper surface of the AlN layer is located on the second surface of the patterned substrate, and the plurality of grooves are formed in the AlN layer.

3. The patterned substrate according to claim 1, wherein the patterned substrate further comprises a dielectric layer; the dielectric layer covers, in the vertical direction, one side, far away from the base plate, of the AlN layer, and an upper surface of the dielectric layer is the second surface of the patterned substrate; and the plurality of grooves are formed in the dielectric layer, and a depth of each of the plurality of grooves is greater than a thickness of the dielectric layer.

4. The patterned substrate according to claim 3, wherein the dielectric layer is made of one of SiN, $SiO_2$ and $Al_2O_3$.

5. The patterned substrate according to claim 3, wherein the thickness of the dielectric layer ranges from 1 μm to 3 μm.

6. The patterned substrate according to claim 1, wherein a thickness of the AlN layer ranges from 1 μm to 2 μm.

7. The patterned substrate according to claim 1, wherein each of the plurality of grooves is in a shape of a circle or a polygon.

8. The patterned substrate according to claim 1, wherein a width of each of the plurality of grooves ranges from 20 μm to 150 μm.

9. The patterned substrate according to claim 1, wherein a distance between outer edges, on the second surface, of two adjacent grooves is less than or equal to 10 μm.

10. The patterned substrate according to claim 1, wherein a width of each of the plurality of grooves gradually increases from bottom to top in the vertical direction, and a side wall of each of the plurality of grooves is an inclined plane.

11. The patterned substrate according to claim 1, wherein a width of each of the plurality of grooves gradually increases from bottom to top in the vertical direction, and a side wall of each of the plurality of grooves is a concave surface.

12. The patterned substrate according to claim 1, wherein a width of each of the plurality of grooves gradually increases from bottom to top in the vertical direction, and a side wall of each of the plurality of grooves is a convex surface.

13. The patterned substrate according to claim 1, wherein
the plurality of grooves are sequentially arranged, in a column direction, into a plurality of rows; and two adjacent rows of the plurality of grooves are arranged in an aligned manner or a staggered manner.

14. The patterned substrate according to claim 1, wherein
the plurality of grooves are sequentially arranged, in a row direction, into a plurality of columns; and two adjacent columns of the plurality of grooves are arranged in an aligned manner or a staggered manner.

15. A semiconductor device, comprising:
a patterned substrate, wherein the patterned substrate comprises, in a vertical direction, a base plate and an AlN layer that are sequentially stacked, the patterned substrate comprises, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, and at least part of the base plate is left below each of the plurality of grooves; and
an epitaxial structure, disposed on a side of the patterned substrate, wherein the vertical direction is a direction perpendicular to the second surface, and the horizontal direction is a direction parallel to the second surface, and an interface between the base plate and the AlN layer is parallel to the horizontal direction; the patterned surface is an annealed surface; each of the plurality of grooves comprises, from bottom to top in the vertical direction, a first part and a second part that are connected with each other, a width of the second part is greater than a width of the first part; the width of the first part gradually increases from bottom to top in the vertical direction, the width of the second part gradually increases from bottom to top in the vertical direction, and an increasing amplitude of the width of the first part is less than an increasing amplitude of the width of the second part,
wherein a thickness of a portion of the AlN layer below each of the plurality of grooves is less than a thickness of a portion of the AlN layer outside the plurality of grooves.

16. The semiconductor device according to claim 15, wherein the epitaxial structure comprises: an n-type semiconductor layer, a p-type semiconductor layer, and an active layer disposed between the n-type semiconductor layer and the p-type semiconductor layer.

17. The semiconductor device according to claim 15, wherein the epitaxial structure comprises an AlN structure or an AlScN structure.

18. A nanotube structure, comprising: a patterned substrate, wherein the patterned substrate comprises, in a vertical direction, a base plate and an AlN layer that are sequentially stacked, the patterned substrate comprises, in the vertical direction, a first surface and a second surface that are oppositely arranged, a bottom surface of the base plate is the first surface of the patterned substrate, the second surface of the patterned substrate is a patterned surface, the second surface is provided with a plurality of grooves that are independent of each other in a horizontal direction and are arranged in an array, and at least part of the base plate is left below each of the plurality of grooves; and
a connection layer, disposed on a side of the patterned substrate, wherein the vertical direction is a direction perpendicular to the second surface, and the horizontal direction is a direction parallel to the second surface, and an interface between the base plate and the AlN layer is parallel to the horizontal direction; the patterned surface is an annealed surface; each of the plurality of grooves comprises, from bottom to top in the vertical direction, a first part and a second part that are connected with each other, a width of the second part is greater than a width of the first part; the width of the first part gradually increases from bottom to top in the vertical direction, the width of the second part gradually increases from bottom to top in the vertical direction, and an increasing amplitude of the width of the first part is less than an increasing amplitude of the width of the second part,
wherein a thickness of a portion of the AlN layer below each of the plurality of grooves is less than a thickness of a portion of the AlN layer outside the plurality of grooves.

* * * * *